United States Patent [19]

Lindmayer

[11] 4,392,010

[45] Jul. 5, 1983

[54] PHOTOVOLTAIC CELLS HAVING CONTACTS AND METHOD OF APPLYING SAME

[75] Inventor: Joseph Lindmayer, Bethesda, Md.

[73] Assignee: Solarex Corporation, Rockville, Md.

[21] Appl. No.: 281,380

[22] Filed: Jul. 8, 1981

Related U.S. Application Data

[63] Continuation-in-part of Ser. No. 3,945, Jan. 16, 1979, Pat. No. 4,297,391.

[51] Int. Cl.³ .................... H01L 31/04; H01L 31/18
[52] U.S. Cl. ..................................... 136/256; 29/572; 427/34; 427/74; 427/88; 427/90; 357/30; 357/67; 357/71; 427/423
[58] Field of Search .............. 427/34, 423, 74, 88–91; 29/572; 136/256; 357/30, 67, 71

[56] References Cited

U.S. PATENT DOCUMENTS

| | | | |
|---|---|---|---|
| 3,106,489 | 10/1963 | Lepselter | 427/89 |
| 4,163,678 | 8/1979 | Bube | 136/256 |
| 4,297,391 | 10/1981 | Lindmayer | 136/256 |
| 4,320,251 | 3/1982 | Narasimhan et al. | 136/256 |

OTHER PUBLICATIONS

M. Finetti et al., "A New Technology to Fabricate High-Efficiency Silicon Concentrator Solar Cells," *IEEE Trans. Electron Devices*, vol. ED-27, pp. 841–843 (1980).

*Primary Examiner*—Aaron Weisstuch
*Attorney, Agent, or Firm*—Watson, Cole, Grindle & Watson

[57] ABSTRACT

Electrically conductive contacts containing zinc or other solderable metals, and aluminum are formed on the front and/or back surfaces of a solar cell. They are deposited by spraying the metals onto the cell surfaces, together or as layers, with the aluminum-containing layer in direct contact with the cell surfaces.

15 Claims, No Drawings

PHOTOVOLTAIC CELLS HAVING CONTACTS AND METHOD OF APPLYING SAME

This application is a continuation-of-part of my application Ser. No. 003,945, filed Jan. 16, 1979, now U.S. Pat. No. 4,297,391, in the name of Joseph Lindmayer and entitled, Method of Applying Electrical Contacts to a Photovoltaic Cell and Product Formed Thereby.

The present invention relates in general to phtovoltaic cells having electrical contacts on their front and/or back surfaces. More specifically, it relates to a method of forming one or both of those electrical contacts and to the cells so produced.

In the foregoing application Ser. No. 003,945, I have described photovoltaic cells that are of a general type well-known in the art. In those cells a host material, e.g., monocrystalline silicon, has been doped with a suitable impurity so that the doped wafer has p or n characteristics. Thereafter, an impurity of a conductivity type opposite to that of the dopant is diffused or otherwise applied to the doped wafer to form a p-n photovoltaic junction at or closely adjacent to the front, light-receiving surface of the wafer. When light energy impinges on the front, light-receiving surface of the cell, electron-hole pairs are excited in the silicon. Because of the presence of the p-n junction, which term is meant to include both p-n and n-p junctions, electrons will be directed toward one or the other of the major surfaces of the cell, and holes toward the other major surface. In a typical n-p cell, electrons are directed to the front, light-receiving surface of the cell and holes toward the back surface. To make the cell operable it is typically necessary to apply electrical contacts to both the front and back surfaces of the cell so that electrons excited by impingement of light on the silicon or other host material will be conducted away from the cell and, after causing work to be done, back to the cell to complete the circuit.

Many problems associated with the application of an electrically conductive grid to the surface of a photovoltaic cell have been mitigated in accordance with the invention disclosed and claimed in the aforementioned parent application. In that application a method is described in which a contact is applied to the surface of a photovoltaic cell by forming particles of electrically conductive material, generally a metal, at a temperature in excess of the alloying temperature of the material and silicon, when silicon is the host material for the cell. The particles are then sprayed to a surface of the cell at a distance such that the particles will contact the surface at a temperature at which they will become adhered to the silicon or other host material from which the cell is formed. Preferably, electrical contact between the silicon and the contact material is accomplished without deep alloying when the contact is being applied to the front surface of the cell. True alloying may take place. However, use of the term, alloying, is not limited to a strict, technical definition of the term but includes adherence at somewhat lower temperatures where the mode of adherence might better be termed, sintering. Such methods of spraying have become commonly known as flame spraying, arc spraying or plasma spraying. Common to all three forms is the fact that fine particles, atoms or ions of a metallic material, such as aluminum, are directed toward the work surface, in this case the surface of a solar cell. Consequently, for the purposes of the present invention these forms of spraying will be used synonymously and the disclosure of such spraying in my parent application is desired to be incorporated by reference herein where requisite.

While said application Ser. No. 003,945, filed Jan. 16, 1979 is believed to be a significant contribution to the art of forming photovoltaic cells in a highly economic manner, nevertheless, as might be expected, a problem has become apparent after the filing of that application. The problem is present when aluminum, the material preferred for use for both front and back contacts of the cells there described, is used. Aluminum is economically priced, and has good electrical characteristics that enable it to serve as a conductor of electricity either for the front, patterned grid of a solar cell or for the back, usually continuous contact layer on the rear, protected surface of the cell. While aluminum meets the basic criteria for a suitable conductor of electricity, it has been found that, as exacerbated when plasma spraying is used to apply aluminum to the surface of the cell, the difference in the coefficients of thermal expansion of aluminum and silicon has resulted in cells being bent or warped to some extent as both the silicon host material and the aluminum contact cool. When the back contact of the cell has been plasma sprayed with aluminum in a continuous layer, such warpage is emphasized. As a result, it has been found desirable to apply the aluminum to the back surface of the solar cell in the form of a pattern rather than a continuous layer, thereby at least to mitigate warpage and bending of the cells during cooling. While warpage will be less evident on the front surface of the cell, where the aluminum contact is applied in the form of a grid rather than a continuous surface, it may be present there as well.

Moreover, when aluminum alone is applied, e.g., to the back surface of the cell, the resulting surface has a grainy characteristic, rather than being smooth. The grainy, almost sandpaper-like surface is resistant to facile attachment of parts such as electrical wiring leads, to the back surface of the cell. The same problem is present, perhaps to a lesser extent, where the grainy texture is on the front grid of the cell, particularly where busbars are to be affixed to collecting fingers of the grid. As a consequence, while the so-formed cells are operable, these deficiencies in the use of aluminum contacts sprayed onto the front and/or back surfaces of the cell have been identified.

I have now determined that the aforementioned problems, which appear to be inherent in the use of aluminum, alone, as a contact material when applied by my spraying methods, can to a large extent be ameliorated by the use of zinc or other solderable soft metal in conjunction with the aluminum or other metallic materials that may be used to form front and/or back contacts for photovoltaic cells. Preferably, at least 10% by weight of zinc or other solderable soft metal should be present. More preferably, the quantity of zinc or equivalent present will be at least 40%, and even as high as about 60% of the metallic composition. Still more preferably, I have found that a range of 40% zinc or equivalent and 60% aluminum, to 60% zinc or equivalent and 40% aluminum, is highly desirable, with my most preferred embodiment being a mixture of zinc or equivalent and aluminum in about equal proportions by weight.

A mixture of aluminum and zinc is stable. Zinc is, like aluminum, a good conductor of electricity. The art has, to a large extent, avoided the use of zinc as contact material because when the electrical contacts containing zinc are applied in a vacuum system, the zinc contaminates the entire system. However, it has been recognized that zinc does have a specific advantage in that, when used in significant proportions, it can render contacts solderable. As a consequence, the use of zinc in the present invention has several different advantages. As stated, it renders the contacts solderable. It also results in a relatively smooth, as contrasted with the relatively grainy, texture of the contacts produced by aluminum, alone. Further, it reduces stresses within the silicon host material and results in no warpage to the solar cell to which the contacts have been applied. Yet, the disadvantage of having zinc contaminate the vacuum system is not present here; in my new method of spraying contacts, no vacuum system need be used.

With respect to specific spraying procedures, whether by flame spraying, arc spraying, or plasma spraying, reference is made herein to said parent application Ser. No. 003,945, in which said methods are described in detail. All such disclosure of said parent application and, indeed, the entirety thereof, where required, is hereby specifically incoporated by reference in the subject application. The present application is preferably most applicable where plasma spraying is employed, because plasma spraying uses higher temperatures and such higher temperatures result in greater stresses within the silicon host material as the cells and their applied contacts cool.

In still another aspect of my invention, zinc may be used to form a portion of the front contact of a solar cell in accordance with the method and product disclosed in my U.S. Pat. No. 4,240,842. In that patent it is disclosed that metallic material may be sprayed through an antireflective coating on a solar cell. The metallic contact material will permeate the coating and have contact portions extending through the coating and into electrical contact with spaced portions of the front, light-receiving surface of the cell. The disclosure of said U.S. Pat. No. 4,240,842 is incorporated by reference herein where required.

In still another aspect of my invention, a layer of solderable soft metal may be sprayed onto the base layer containing aluminum, which base layer may or may not also contain a solderable soft metal. The so-called overcoat layer adheres to the base layer and forms a layer that is easily solderable so that the cells may be interconnected with ease. In this embodiment, the base layer first applied to either or both of the front and back surfaces of the wafer contains aluminum, in whole or in part.

Exemplarily, when sprayed onto the back surface of a cell, a layer of aluminum, or aluminum and zinc in equal amounts by weight, about 1 mil thick, is formed. The spray gun can be oscillated when spraying pure aluminum; when spraying aluminum and zinc, an al-zn alloy wire may be used. Thereafter a zinc overcoat can be applied by spraying. The overcoat has taken a rounded form, preferably being about 1 mil thick at the edges of the wafer and about 2 mils thick at the center thereof.

The term, solderable soft metal, has been used herein. Such a metal is typified by zinc, which is my preferred such metal at this time. However, I contemplate that tin, lead, copper and silver, among other metals, could be substituted for or used in conjunction with zinc. Obviously, special problems are present in the case of lead, which is excessively toxic, and silver, which is expensive. Thus, zinc appears to be the most suitable, solderable soft metal for use at this time.

While the present invention has been described with reference to best modes thereof, numerous alterations and modifications will be apparent to those of skill in the art without departing from the spirit of the invention. As to all such obvious alterations and modifications, it is desired that they be included within the purview of my invention, which is to be limited only by the scope, including equivalents, of the following appended claims.

I claim:

1. A method of applying an electrically conductive contact to the surface of a photovoltaic cell, comprising forming a mixture of aluminum and a solderable soft metal at a temperature in excess of the alloying temperature of said mixture and silicon, said metal comprising at least about 10% of said mixture, and spraying said mixture toward said surface at a distance such that said mixture will contact said surface at a temperature at which it will alloy with said silicon and thereby adhere to said surface.

2. A method as claimed in claim 1, in which said solderable soft metal is zinc.

3. A method as claimed in claim 2, in which said mixture contains between about 40 and 60% zinc.

4. A method as claimed in claim 1, in which said photovoltaic cell surface is the front, light-receiving surface of the cell and has a p-n junction located beneath and closely adjacent to said surface, said mixture contacting said front surface at a temperature at which said particles do not penetrate said surface to an extent sufficient to substantially damage said p-n junction.

5. A method as claimed in claim 1, in which said surface is the back, protected surface of the cell, and thereafter forming a p-n junction at the opposed, front surface of the cell.

6. A method as claimed in claim 1, in which, prior to spraying said mixture, p-n junctions have been formed at the front surface and the back surface of the cell, and said mixture is sprayed onto said back surface at a temperature such that aluminum in said mixture penetrates said back surface and overcomes said back surface p-n junction to form a high-low junction at said back surface.

7. A method as claimed in claim 1, in which, prior to spraying said mixture, a layer of diffusant glass is formed on said back surface and said mixture is sprayed onto said back surface at a temperature such that it penetrates said glass layer and said back surface and overcomes said back surface p-n junction to form a high-low junction at said back surface.

8. A method as claimed in claim 4, in which said front surface of said cell has an antireflective coating overlying it, and said mixture penetrates said antireflective coating and contacts and adheres to said underlying front surface at spaced locations thereof.

9. A method of applying an electrically conductive contact to the surface of a silicon photovoltaic cell, comprising spraying a metal comprised of aluminum toward said surface at a distance such that said metal will contact said surface at a temperature at which it will alloy with the silicon and form a layer adhered to said surface, and thereafter spraying a coating of a solderable soft metal over said adhered layer.

10. A method as claimed in claim 9, in which said metal comprised of aluminum also contains at least 10% of a solderable, soft metal.

11. A method as claimed in claim 10, in which said metal is comprised of approximately 50% aluminum and 50% zinc.

12. A photovoltaic cell having a front surface adapted to receive and absorb light impinging thereon and a back surface opposed to said front surface, and an electrical contact covering at least a portion of at least one of said surfaces, said contact being comprised of a layer of a mixture of aluminum and at least about 10% zinc.

13. A photovoltaic cell as claimed in claim 12, said contact being formed with an overcoat layer including a solderable soft metal overlying and adhered to said layer comprised of aluminum.

14. A photovoltaic cell as claimed in claim 12, in which said contact is comprised of a layer of a mixture of aluminum and at least about 40% zinc.

15. A photovoltaic cell as claimed in claim 12, in which said contact is comprised of a layer of a mixture of about 50% aluminum and 50% zinc.

* * * * *